(12) United States Patent
Yang

(10) Patent No.: US 11,823,744 B2
(45) Date of Patent: Nov. 21, 2023

(54) PROGRAMMING TECHNIQUES FOR MEMORY DEVICES HAVING PARTIAL DRAIN-SIDE SELECT GATES

(71) Applicant: SanDisk Technologies LLC, Addison, TX (US)

(72) Inventor: Xiang Yang, Santa Clara, CA (US)

(73) Assignee: SanDisk Technologies LLC, Addison, TX (US)

(*) Notice: Subject to any disclaimer, the term of this patent is extended or adjusted under 35 U.S.C. 154(b) by 227 days.

(21) Appl. No.: 17/487,634

(22) Filed: Sep. 28, 2021

(65) Prior Publication Data

US 2023/0095757 A1 Mar. 30, 2023

(51) Int. Cl.
| | |
|---|---|
| *G11C 11/34* | (2006.01) |
| *G11C 16/22* | (2006.01) |
| *G11C 16/26* | (2006.01) |
| *G11C 16/10* | (2006.01) |
| *G11C 16/04* | (2006.01) |

(52) U.S. Cl.
CPC .......... *G11C 16/22* (2013.01); *G11C 16/0483* (2013.01); *G11C 16/10* (2013.01); *G11C 16/26* (2013.01)

(58) Field of Classification Search
CPC ......... G11C 16/10; G11C 16/30; G11C 16/12; G11C 16/0483; H01L 27/115

USPC .................................. 365/185.05, 185.18
See application file for complete search history.

(56) References Cited

U.S. PATENT DOCUMENTS

| | | | |
|---|---|---|---|
| 8,988,939 B2 * | 3/2015 | Dunga ............... | G11C 16/3427 365/185.11 |
| 10,297,323 B2 * | 5/2019 | Yu ............................ | G11C 8/08 |

\* cited by examiner

*Primary Examiner* — Son T Dinh
(74) *Attorney, Agent, or Firm* — DICKINSON WRIGHT PLLC; Steven C. Hurles

(57) ABSTRACT

A method of operating a memory device. The method includes the step of preparing a memory device that includes a first group of the memory holes with full SGD transistors and a second group of the memory holes with partial SGD transistors. The second group includes both a set of selected partial SGD transistors and a set of unselected partial SGD transistors. The method proceeds with electrically floating a first unselected partial SGD transistor of the set of unselected partial SGD transistors. With the at least one first unselected partial SGD transistor electrically floating, the method continues with reducing a voltage applied to at least one transistor or memory cell adjacent the first unselected partial SGD transistor such that a voltage of the first unselected partial SGD transistor is decreased through a capacitance coupling effect.

20 Claims, 15 Drawing Sheets

PROGRAMMING TECHNIQUES FOR MEMORY DEVICES HAVING PARTIAL DRAIN-SIDE SELECT GATES

TECHNICAL FIELD

This disclosure is related generally to non-volatile memory devices that have shallow etching features that cut through portions of memory holes.

BACKGROUND

Many memory devices are provided as internal, semiconductor, integrated circuits in computers or other electronic devices. There are many different types of memory, including random-access memory (RAM), read only memory (ROM), dynamic random-access memory (DRAM), synchronous dynamic random-access memory (SDRAM), an electrically erasable programmable read-only memory (EEPROM), a flash memory, and/or the like. In an EEPROM or flash NAND array architecture, memory cells may be arranged in a matrix of rows and columns such that gates of each memory cell are coupled by rows to word lines. The memory cells may be arranged together in strings such that memory cells in a given string are coupled together in series, from source to drain, between a common source line and a common bit line.

In some NAND memory devices, a shallow etching features (SHE) partially cuts through portions of a plurality of memory holes that include memory cells and drain-side select gates (SGDs). Since some cells are cut, one SGD may be exposed to the electric field of a neighbor SGD, which could unintentionally turn on the one SGD and cause current leakage and compromise both programming and sensing operations. This phenomenon is commonly known as the neighbor SGD interference effect (NSI).

SUMMARY

One aspect of the present disclosure is related to a method of operating a memory device. The method includes the step of preparing a memory device that includes a plurality of memory holes. The plurality of memory holes includes a first group of the memory holes with full SGD transistors and a second group of the memory holes with partial SGD transistors. The second group includes both a set of selected partial SGD transistors and a set of unselected partial SGD transistors. The method proceeds with electrically floating a first unselected partial SGD transistor of the set of unselected partial SGD transistors. With the at least one first unselected partial SGD transistor electrically floating, the method continues with reducing a voltage applied to at least one transistor or memory cell adjacent the first unselected partial SGD transistor such that a voltage of the first unselected partial SGD transistor is decreased through a capacitance coupling effect.

According to another aspect of the present disclosure, the step of reducing the voltage applied to at least one transistor or memory cell adjacent the first unselected partial SGD transistor is further defined as reducing the voltage applied to a memory cell of a dummy word line that does not store data.

According to yet another aspect of the present disclosure, the step of reducing the voltage applied to the at least one transistor or memory cell adjacent the first unselected partial SGD transistor is further defined as reducing the voltage applied to an adjacent unselected partial SGD transistor of the set of unselected partial SGD transistors.

According to still another aspect of the present disclosure, the method further includes the step of electrically floating a second unselected partial SGD transistor of the set of unselected partial SGD transistors.

According to a further aspect of the present disclosure, the first and second unselected partial SGD transistors are adjacent one another and are located between another unselected partial SGD transistor and a memory cell of a dummy word line.

According to yet a further aspect of the present disclosure, the step of reducing the voltage applied to at least one transistor or memory cell is further defined as reducing the voltages applied to the another unselected partial SGD transistor and to the memory cell of the dummy word line such that the voltages of both the first and second unselected partial SGD transistors are decreased through the capacitance coupling effect.

According to still a further aspect of the present disclosure, the steps are a part of a programming operation.

According to another aspect of the present disclosure, the steps are a part of a sensing operation.

Another aspect of the present disclosure is related to a memory device that includes a plurality of memory holes including a first group of memory holes and a second group of memory holes. The first group of memory holes has full select gate drains, and the second group of memory holes includes a set of unselected partial SGD transistors and a set of selected partial SGD transistors. The memory device further includes control circuitry that is in electrical communication with the plurality of memory holes. The control circuitry is configured to electrically float a first unselected partial SGD transistor of the set of unselected partial SGD transistors. With the at least one unselected partial SGD transistor electrically floating, the control circuitry is further configured to reduce a voltage applied to at least one transistor or memory cell adjacent the first unselected partial SGD transistor such that a voltage of the first unselected partial SGD transistor is decreased through a capacitance coupling effect.

According to another aspect of the present disclosure, the at least one transistor or memory cell adjacent the first unselected partial SGD transistor is a memory cell of a dummy word line that does not store data.

According to yet another aspect of the present disclosure, the at least one transistor or memory cell is an adjacent unselected partial SGD transistor of the set of unselected partial SGD transistors.

According to still another aspect of the present disclosure, the control circuitry is further configured to electrically float a second unselected partial SGD transistor of the set of unselected partial SGD transistors.

According to a further aspect of the present disclosure, the first and second unselected partial SGD transistors are adjacent to one another and are located between another unselected partial SGD transistor and a memory cell of a dummy word line.

According to yet a further aspect of the present disclosure, the control circuitry is further configured to reduce the voltages applied to the another unselected partial SGD transistor and the memory cell of the dummy word line such that the voltages of both the first and second unselected partial SGD transistors are decreased through the capacitance coupling effect.

According to still a further aspect of the present disclosure, the control circuitry is configured to electrically float the first unselected partial SGD transistor and reduce the voltage applied to the at least one transistor or memory cell during a programming operation.

According to another aspect of the present disclosure, the control circuitry is configured to electrically float the first unselected partial SGD transistor and reduce the voltage applied to the at least one transistor or memory cell during a sensing operation.

Yet another aspect of the present disclosure is related to an apparatus that includes a memory device. The memory device includes a plurality of full memory holes with full SGD transistors and a plurality of partial memory holes with partial SGD transistors. The memory device further includes a programming and sensing means for programming and reading a plurality of memory cells. The programming and sensing means is configured to electrically float a first unselected partial SGD transistor. With the at least one unselected partial SGD transistor electrically floating, the programming and sensing means is configured to reduce a voltage applied to at least one transistor or memory cell adjacent the first unselected partial SGD transistor such that a voltage of the first unselected partial SGD transistor is decreased through a capacitance coupling effect.

According to another aspect of the present disclosure, the at least one transistor or memory cell adjacent the first unselected partial SGD transistor is a memory cell of a dummy word line that does not store data.

According to yet another aspect of the present disclosure, the at least one transistor or memory cell is an adjacent unselected partial SGD transistor of the set of unselected partial SGD transistors.

According to still another aspect of the present disclosure, the programming and sensing means is further configured to electrically float a second unselected partial SGD transistor of the set of unselected partial SGD transistors.

BRIEF DESCRIPTION OF THE DRAWINGS

A more detailed description is set forth below with reference to example embodiments depicted in the appended figures. Understanding that these figures depict only example embodiments of the disclosure and are, therefore, not to be considered limiting of its scope. The disclosure is described and explained with added specificity and detail through the use of the accompanying drawings in which.

DESCRIPTION OF THE ENABLING EMBODIMENTS

One approach to addressing NSI is to apply a low (preferably negative) voltage to the "attacker" unselected SGD, thereby reducing a voltage difference between the attacker unselected SGD and a "victim" selected SGD during programming and sensing (i.e., read and verify) operations. One way to achieve a negative voltage at the attacker SGD is through the use of a negative voltage pump/source. However, such negative voltage pumps/sources are costly both in terms of real estate within the memory device and also resource consumption. According to the programming techniques discussed in further detail below, a negative voltage at the attacker SGD is achieved during programming and sensing operations without the use of a negative voltage source through a capacitance coupling effect. Because the negative voltage pump/source is not needed, the space and resources it would otherwise occupy can instead be devoted to other features in the memory device to improve its performance.

As discussed in further detail below, during a negative coupling stage of a programming or a sensing operation, the SGD(s) is/are floated and the voltage of at least one of an unselected top SGD (SGDT) or a memory cell of a dummy word line is/are ramped downwardly to drive the attacker SGD or SGDs to a lower voltage. The SGDT and/or the dummy word line is/are located immediately adjacent the SGD, and thus, a capacitance coupling effect through the dielectric between the SGDT and the attacker SGD and/or between the memory cell of the dummy word line and the attacker SGD has the effect of lowering a voltage of the floating attacker SGD. This operation is performed during programming and/or sensing operations to prevent NSI from causing a selected (victim) SGD from inadvertently being turned "on" and leaking current.

Figure 1A:
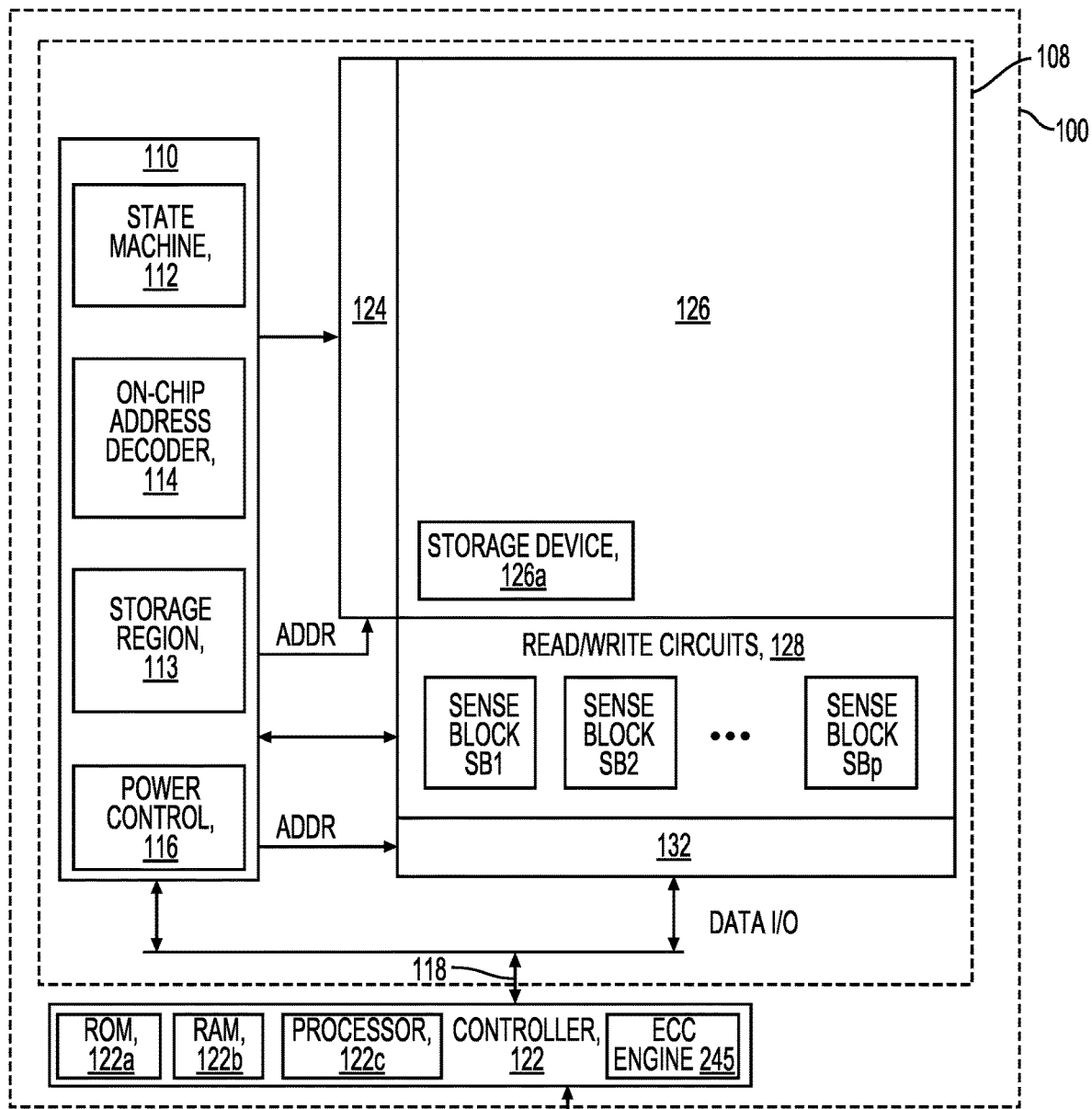
FIG. 1A is a block diagram of an example memory device.

FIG. 1A is a block diagram of an example memory device that can implement the programming techniques discussed herein to prevent the NSI effect. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for another data state for the memory cells assigned to represent another data state.

Figure 1B:
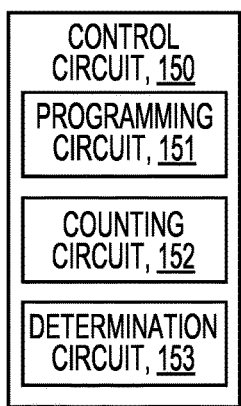
FIG. 1B is a block diagram of an example control circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
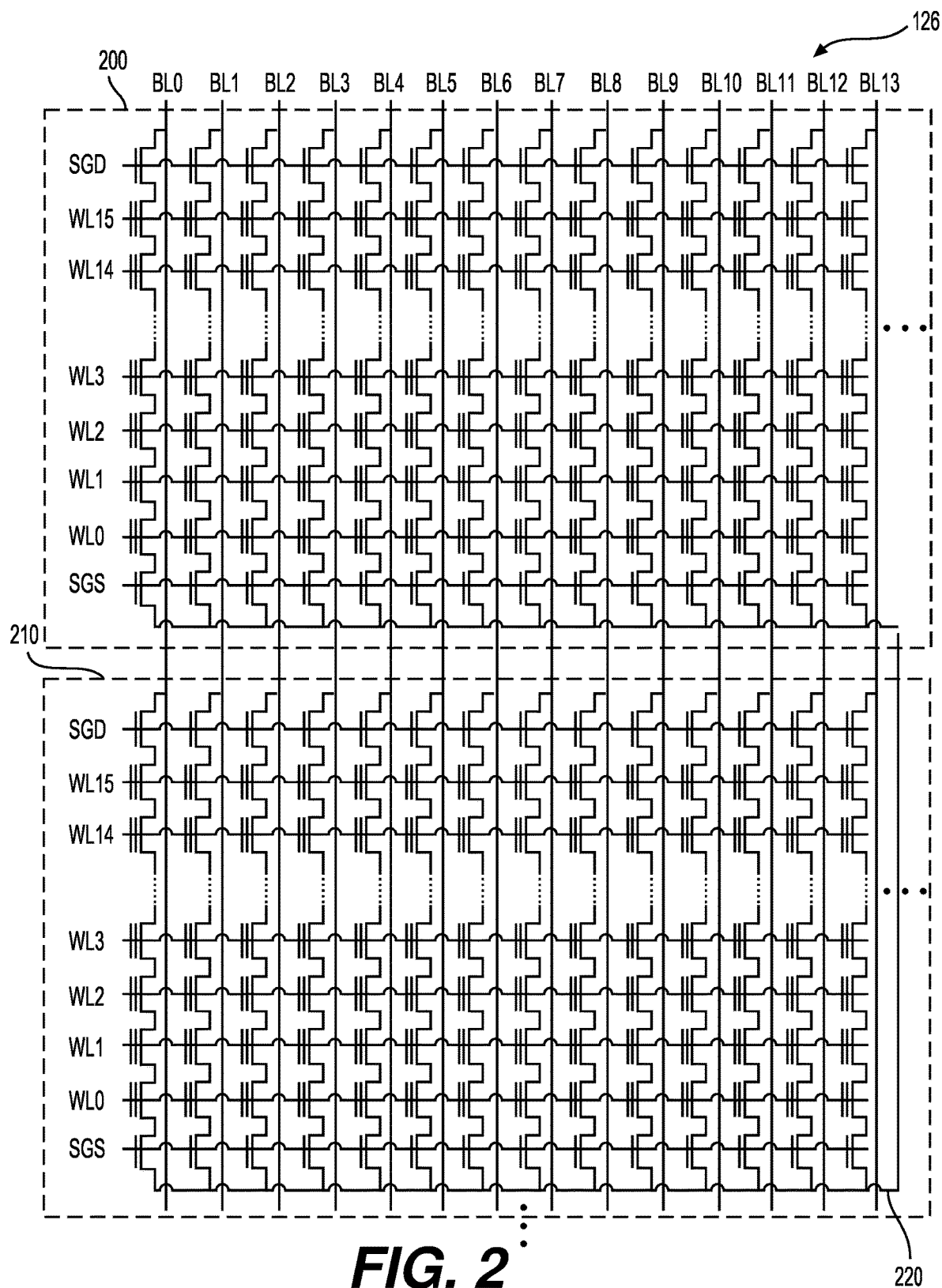
FIG. 2 depicts blocks of memory cells in an example two-dimensional configuration of the memory array of FIG. 1A.

FIG. 2 illustrates schematic views of three types of memory architectures utilizing staggered memory strings.

For example, reference number 201 shows a schematic view of a first example memory architecture, reference number 203 shows a schematic view of a second example memory architecture, and reference number 205 shows a schematic view of a third example memory architecture. In some embodiments, as shown, the memory architecture may include an array of staggered NAND strings.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to an SGD, and the control gates of the drain select gates are connected via a common SGD line. The NAND strings are connected at their other end to a source-side select gate (SGS) which, in turn, is connected to a common source line 220. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

Figure 3A:
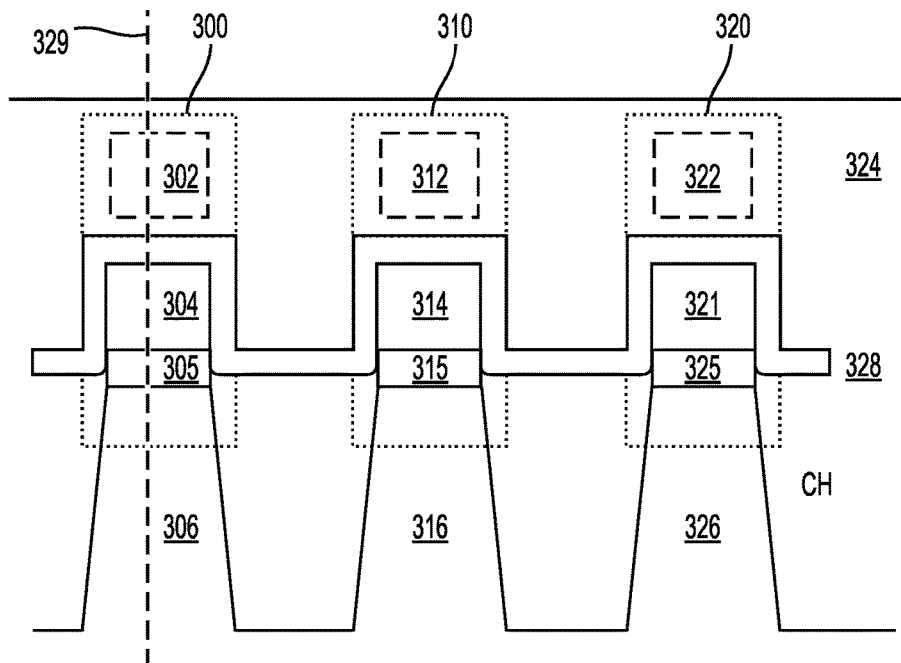
FIG. 3A and FIG. 3B depict cross-sectional views of example floating gate memory cells in NAND strings.
Figure 3B:
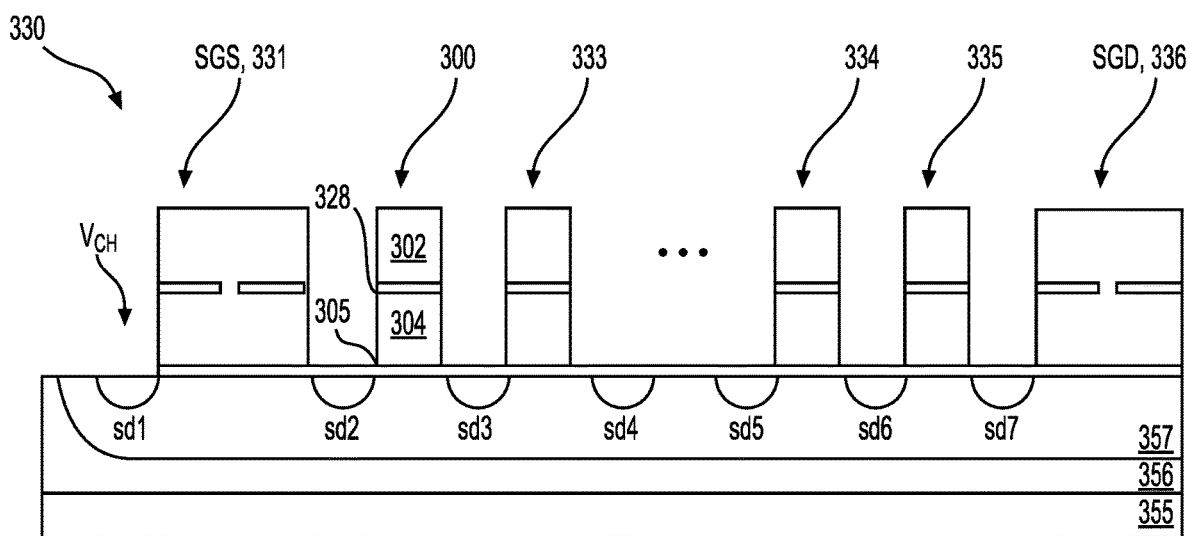

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this Figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
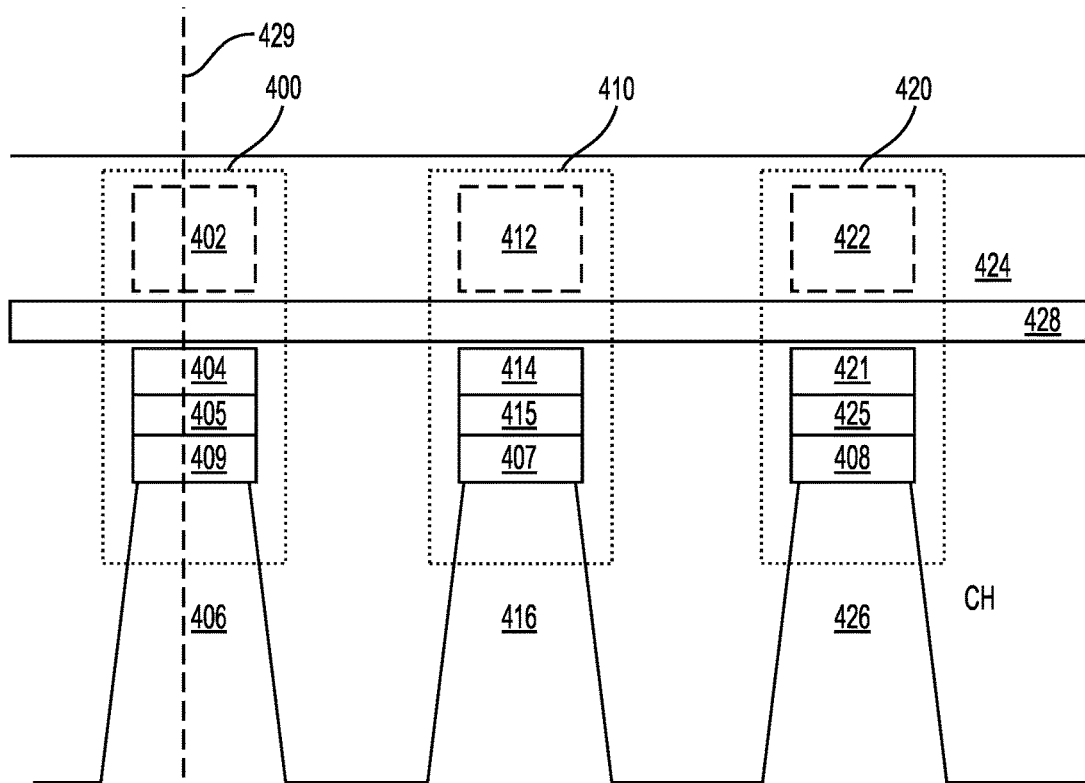
FIG. 4A and FIG. 4B depict cross-sectional views of example charge-trapping memory cells in NAND strings.
Figure 4B:
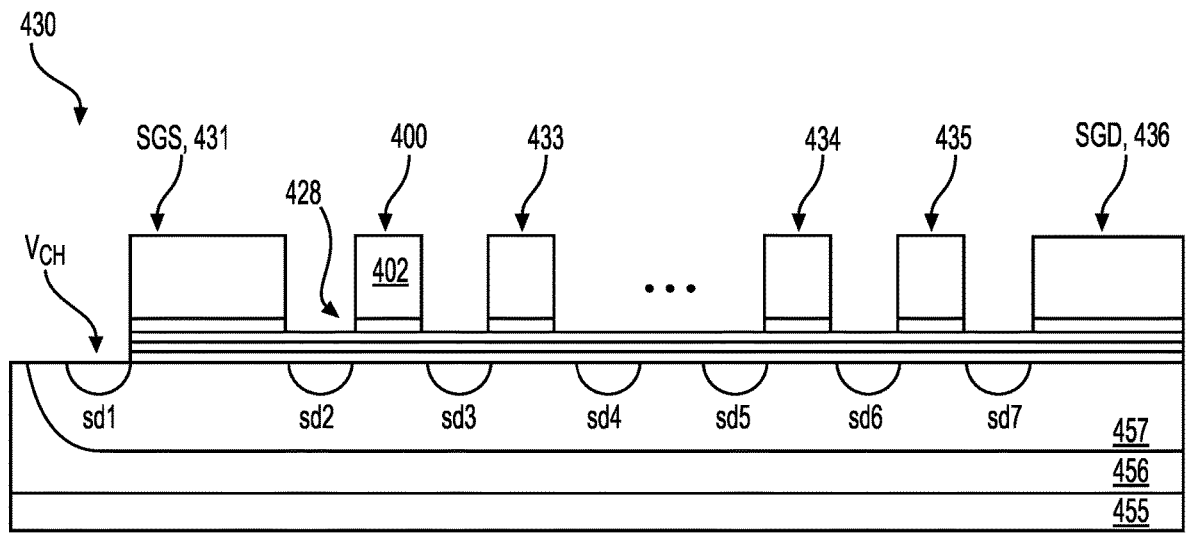

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436. Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
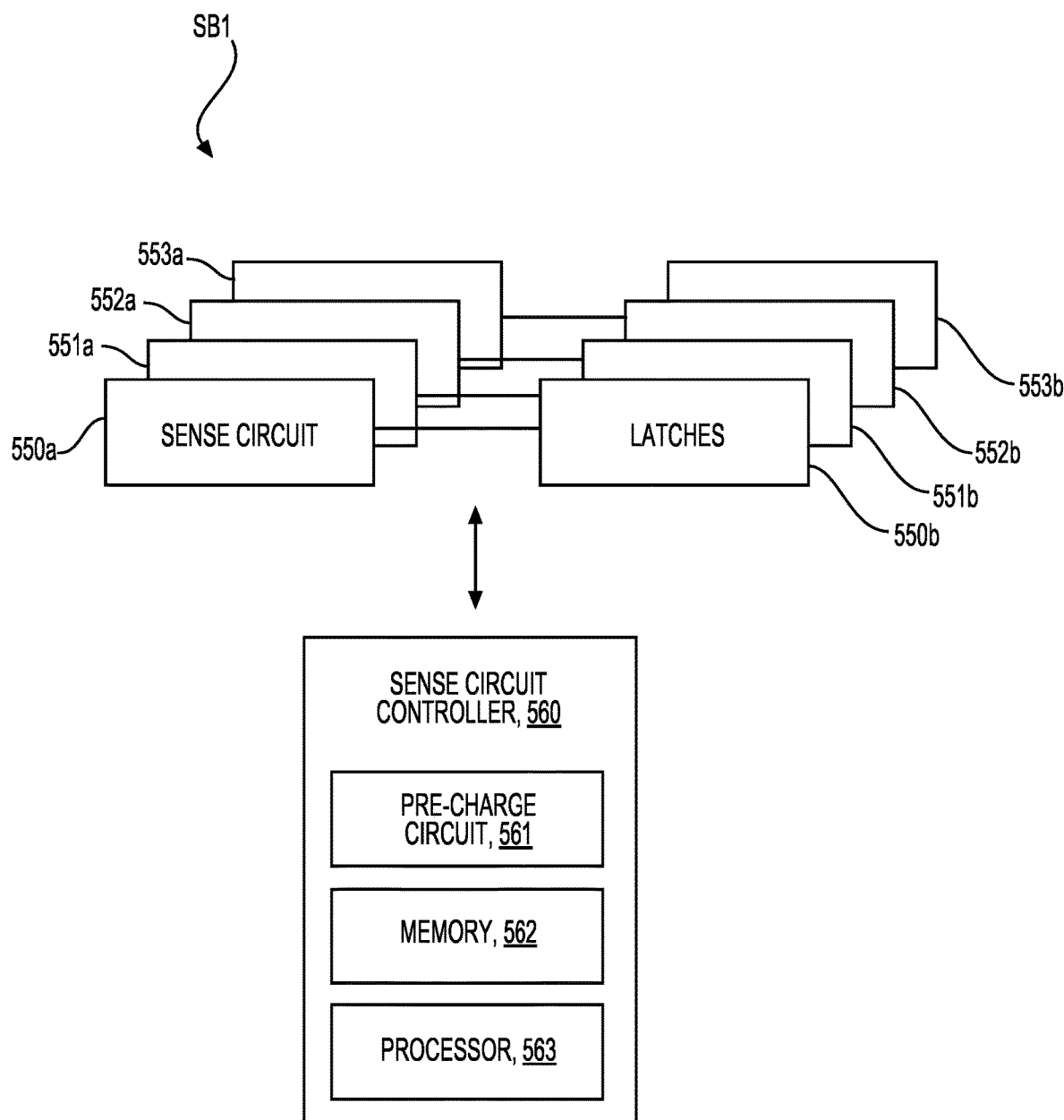
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
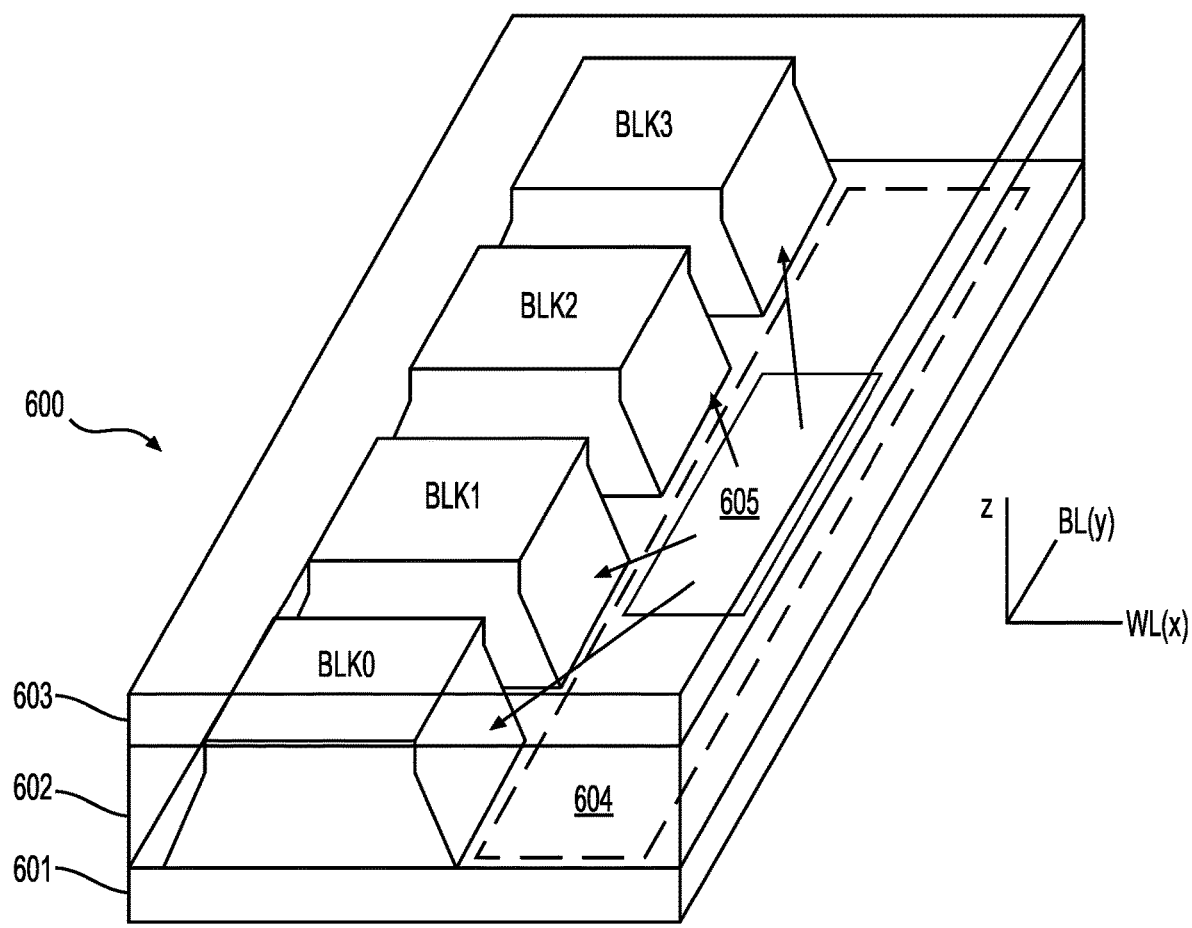
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
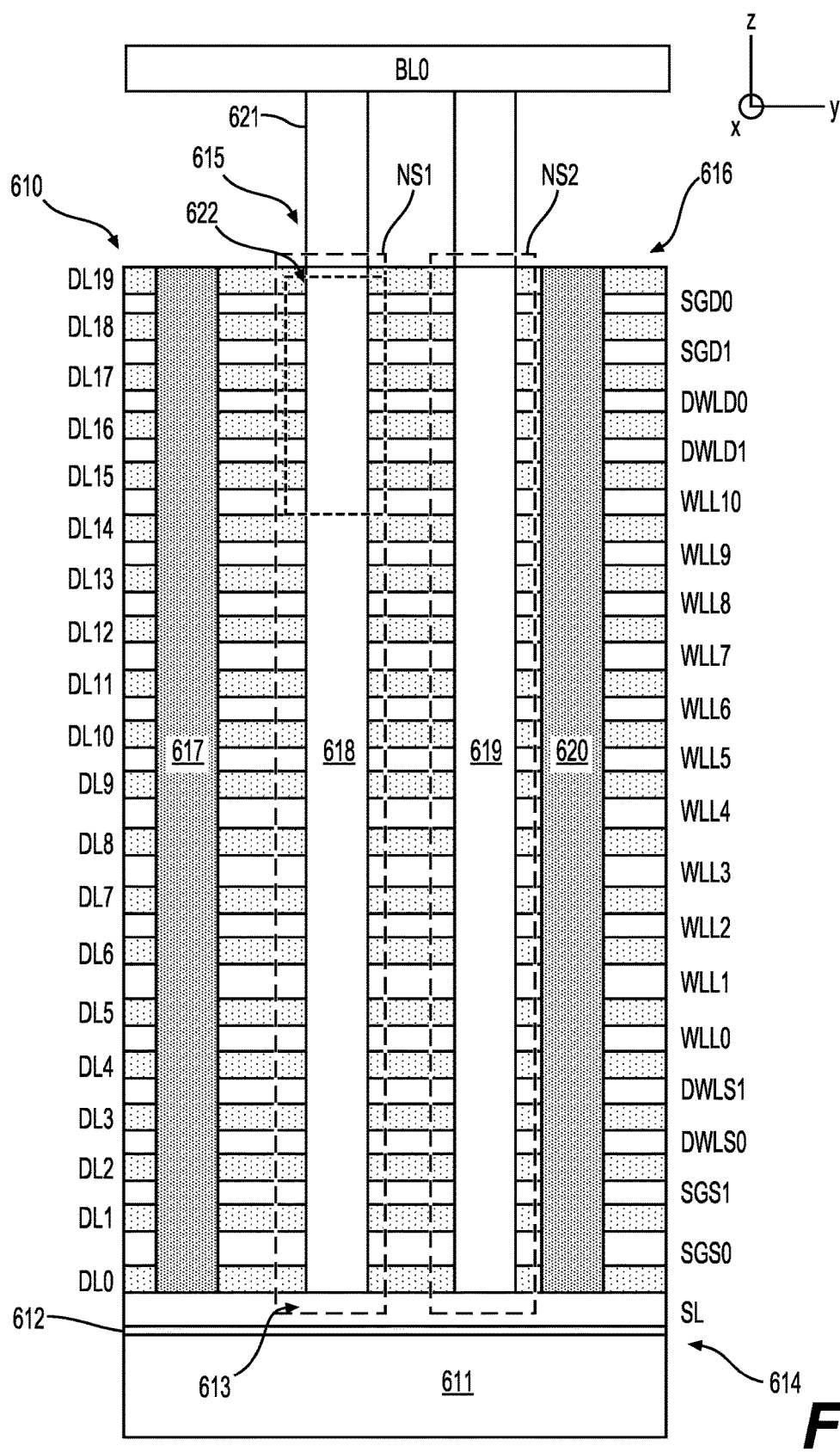
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
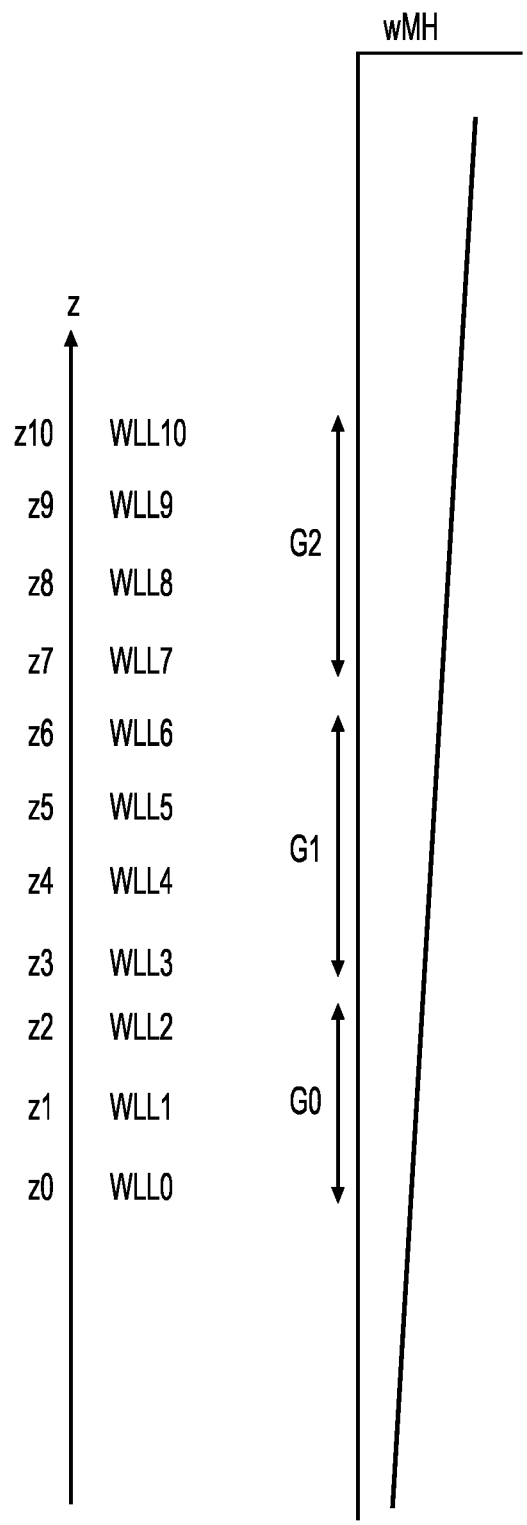
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
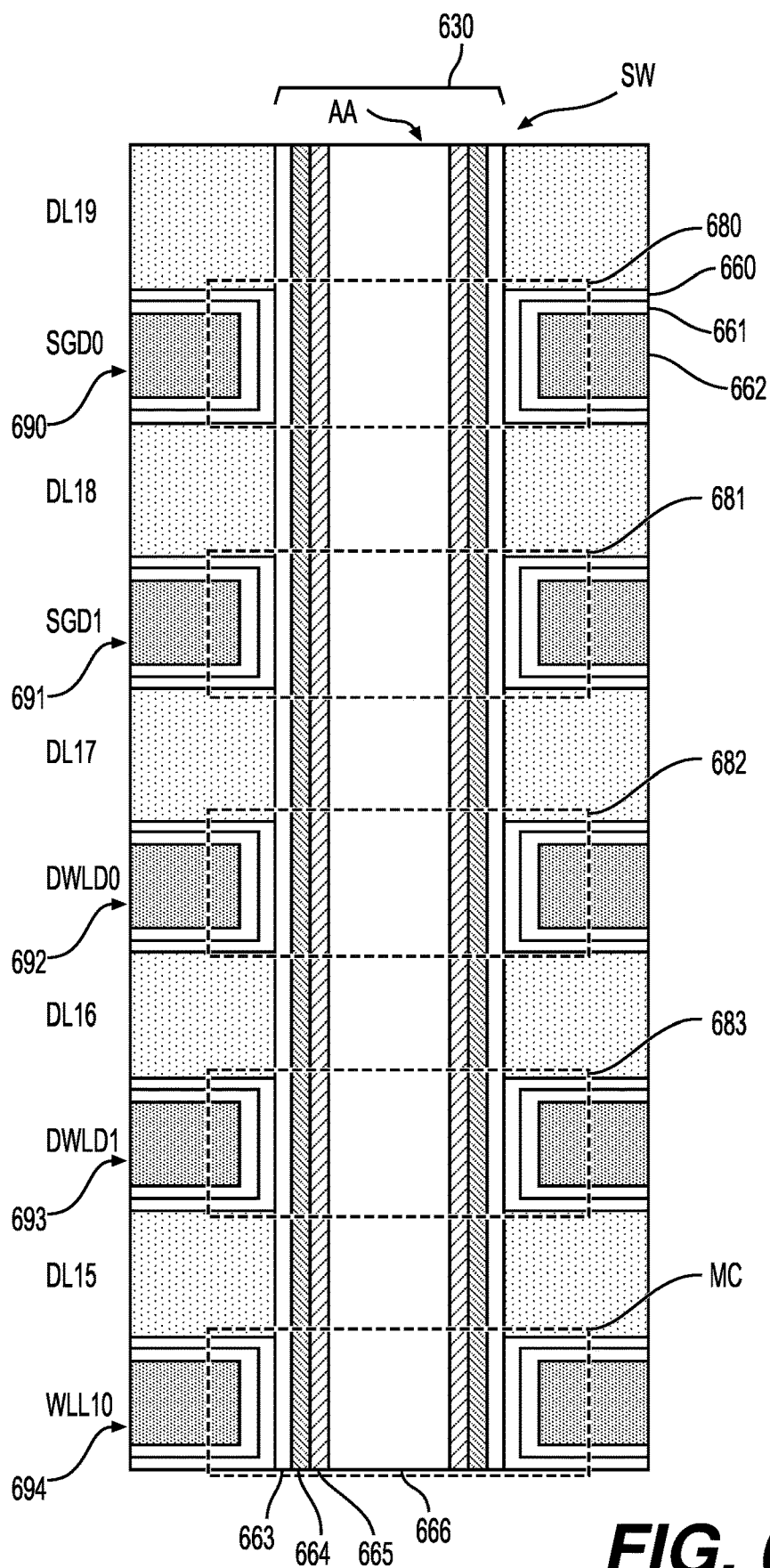
FIG. 6D depicts a close-up view of region 722 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 of dummy word lines and a data memory cell MC of a data word line. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a data memory cell MC is programmed, electrons are stored in a portion of the charge-trapping layer 663 which is associated with the memory cell MC. These electrons are drawn into the charge-trapping layer 663 from the channel 665, and through the tunneling layer 664. The Vth of a memory cell MC is increased in proportion to the amount of stored charge. During an erase operation, the electrons return to the channel 665.

Each of the memory holes 630 can be filled with a plurality of annular layers comprising a blocking oxide layer, a charge trapping layer 663, a tunneling layer 664 and a channel layer 665. A core region of each of the memory holes 630 is filled with a body material, and the plurality of annular layers are between the core region and the word line in each of the memory holes 630.

The NAND string can be considered to have a floating body channel 665 because the length of the channel 665 is not formed on a substrate. Further, the NAND string is provided by a plurality of word line layers above one another in a stack, and separated from one another by dielectric layers.

Figure 7A:
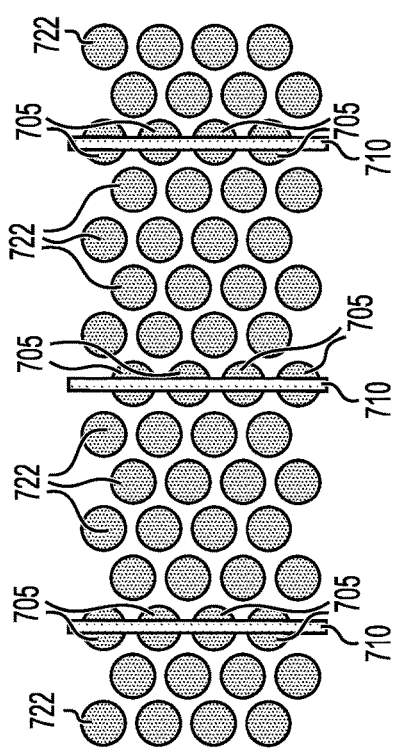
FIG. 7A depicts a top view of an example word line layer of an exemplary stack.

FIG. 7A shows a schematic plan view of a memory array 700 with a plurality of memory holes 722, which can be vertical memory cell strands as described herein, and a plurality of dummy holes 705, which are not complete memory structures. A shallow trench etch or shallow etching feature (SHE) 710 extends through a plurality of word lines (for example, five) and a plurality of SGDs but not fully through the chip to electrically isolate adjacent strings from one another. The SHE extends directly through a group of aligned dummy holes 705, thereby preventing those dummy holes 705 from storing data or otherwise being functional memory cells.

Figure 8A:
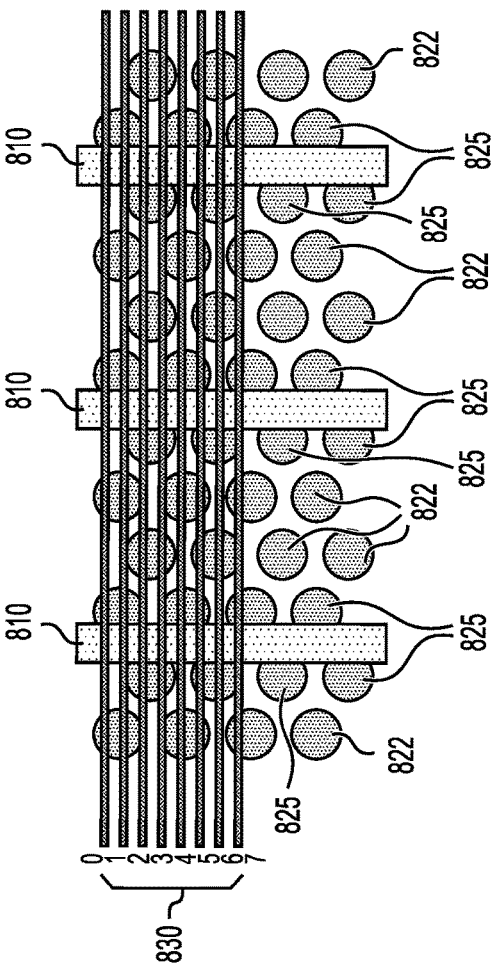
FIG. 8A depicts a top view of an example word line layer of another exemplary stack.
Figure 8B:
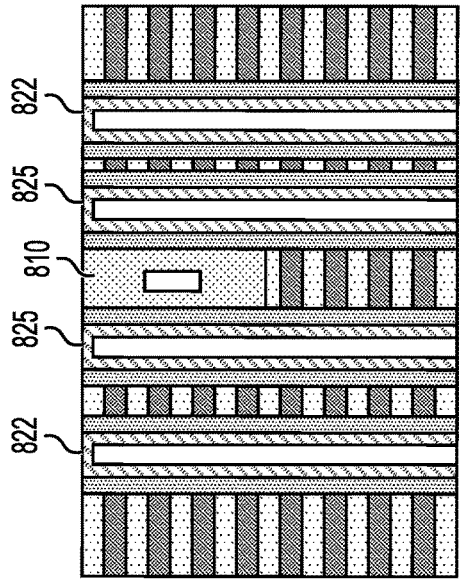
FIG. 8B depicts a cross-sectional view of the exemplary stack of FIG. 8A.
Figure 7B:
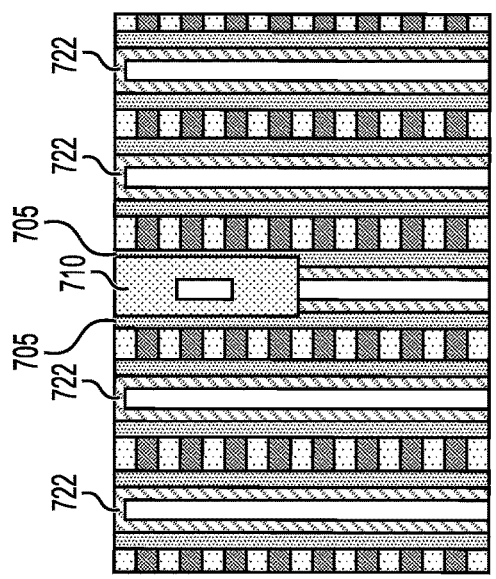
FIG. 7B depicts a cross-sectional view of the exemplary stack of FIG. 7A.

Referring now to FIGS. 8A and 8B, there are no dummy memory holes. Unlike the memory structure 700 of FIGS. 7A and 7B, the SHE 810 is located in a gap between two adjacent rows of memory cells and overlaps with memory holes 825, thereby creating a working strand that has a trench etched down into a side of at least one SGD switch (preferably a plurality of SGD switches) at the top of the working memory strand, here shown as memory holes 825. This configuration substantially improves yield and memory density as all of the memory holes 822, 825 are functional, i.e., fewer memory holes are wasted.

Unlike the fully circular memory holes 822, the memory holes 825, including their respective SGDs, that are partially cut by the SHE 810 have a semi-circular shape, which can either be a half circle or can be more or less than a half-circle. Thus, the cut memory holes 825 are differently sized and shaped than the memory holes 825. As discussed in further detail below, the memory cells that are coupled to semi-circle SGDs can have different programming and sensing characteristics than those coupled to full-circle SGDs. The techniques taught herein improve programming and sensing of these memory cells.

The memory holes 822, 825 are connected with a plurality of bit lines 830 (labeled as bit lines 0-7 in FIG. 8A). For ease of illustration, only eight bit lines 830 have been shown. The bit lines 830 extend over above the memory holes 822, 825 and are connected to select memory holes via connection points. The memory holes 822, 825 in the each string area are also connected at one end to a drain line and at the other end to a source line.

Figure 10:
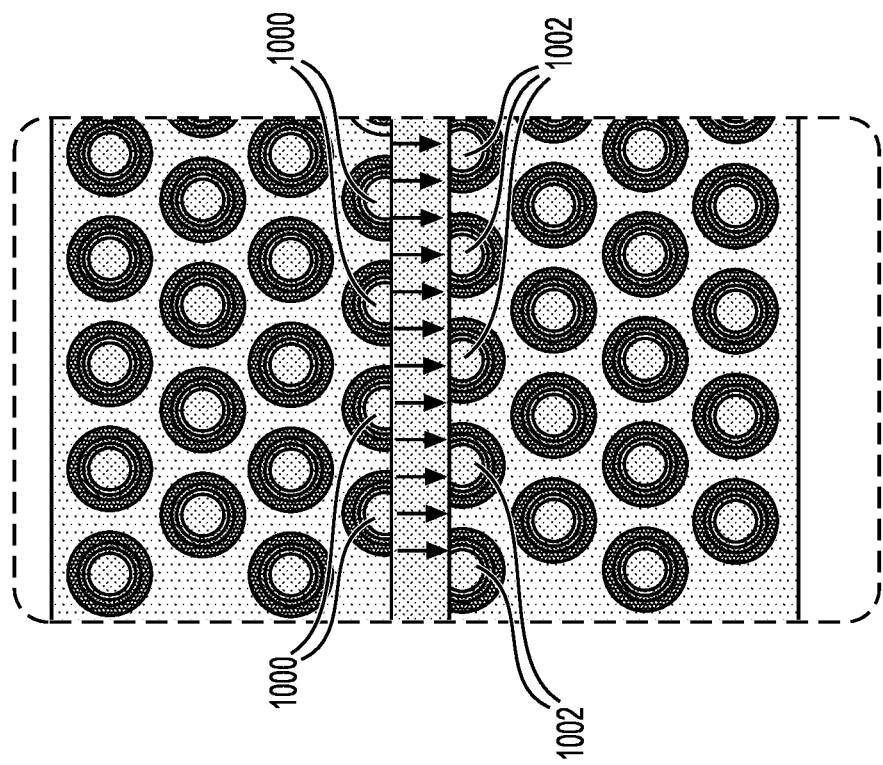
FIG. 10 is a top view of a memory block and illustrating a plurality of attacker SGDs influencing the behaviors of a plurality of victim SGDs.
Figure 9:
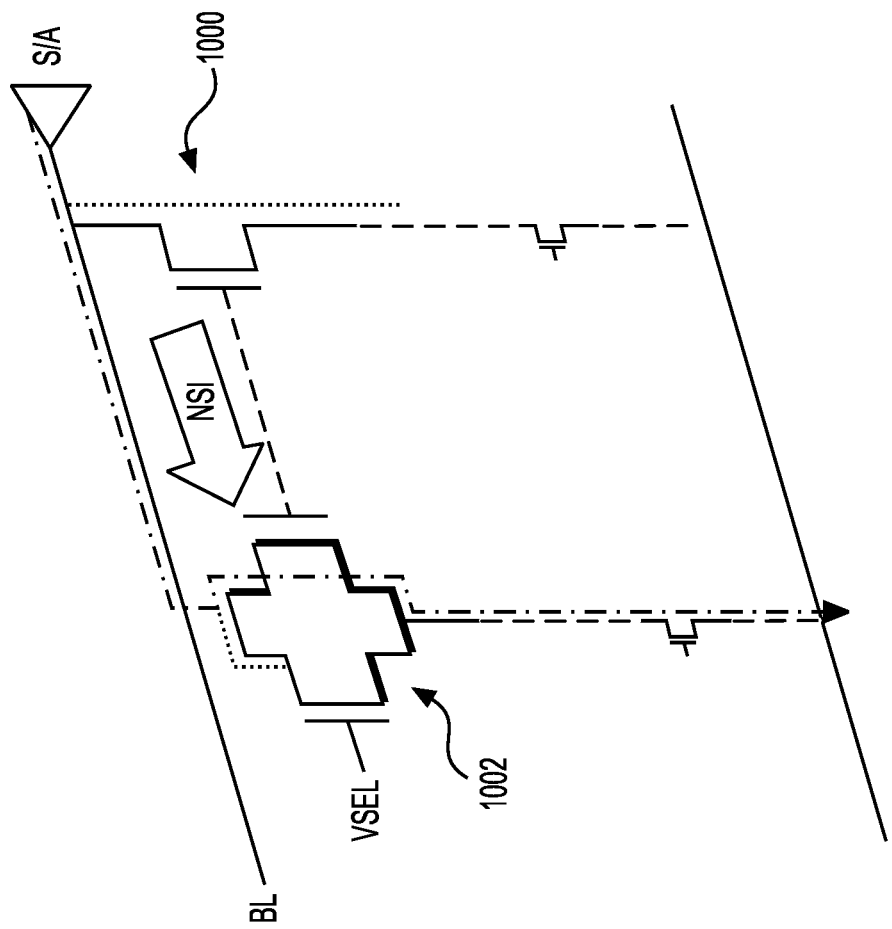
FIG. 9 is a schematic view depicting an electric field of an attacker SGD influencing the behavior of a victim SGD.

As discussed above and shown schematically in FIGS. 9 and 10, during programming and sensing operations, a voltage difference between an attacker SGD 1000 of an unselected string and a victim SGD 1002 of a selected string can cause NSI issues during both programming and sensing operations. Specifically, the NSI effect can improperly switch the victim SGD 1002 of the selected string to from "off" to "on," which can result in unintentional current leakage across the victim SGD 1002. The NSI effect can be counteracted by applying a negative voltage bias to the attacker SGD 1000 of the unselected string. In an example embodiment, applying a negative one Volt (−1 V) SGD bias to the attacker SGD 1000 compensates for the NSI effect during sensing, and a negative two Volt (−2 V) bias applied to the attacker SGD 1000 compensates for the NSI effect during programming. According to the following programming techniques, these negative voltage SGD biases are achieved without a negative voltage source/pump.

Figure 11:
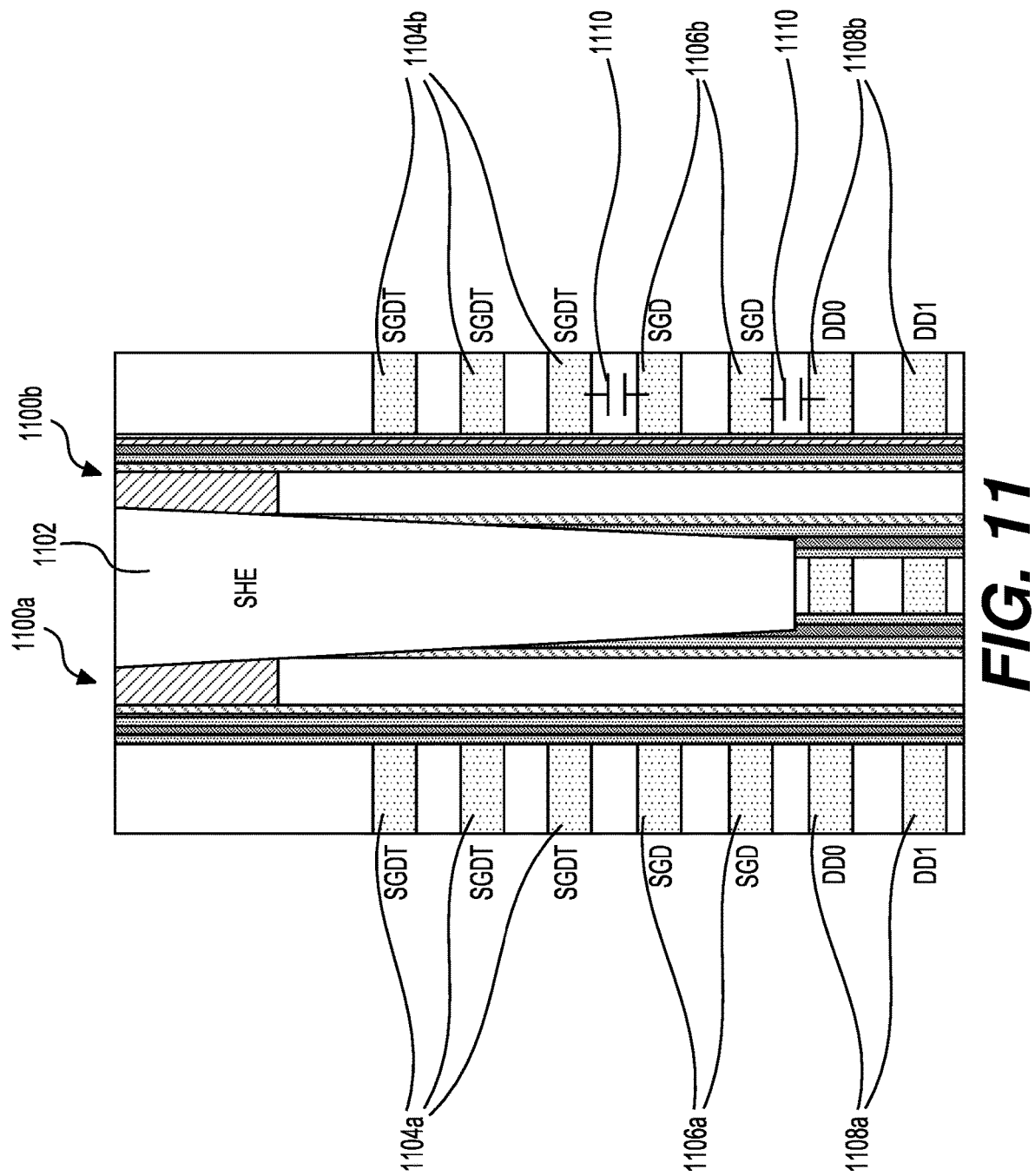
FIG. 11 is a cross-sectional view of a pair of memory holes and illustrating the capacitance coupling effect that influences the voltages of a pair of floating unselected SGDs.

Referring now to FIG. 11, a cross-sectional view of a pair of partial memory holes 1100a, 1100b that are partially cut by the SHE 1102 is generally shown. Each memory hole 1100a, 1100b includes three top SGDs (referred to as SGDTs 1104a, 1104b), two additional SGDs 1106a, 1106b, at least two dummy memory cells 1108a, 1108b of dummy word lines (DD0, DD1), and data memory cells (not shown) of a plurality of data word lines. In this example, the memory hole 1100a on the left is a selected string, and the memory hole 1100b on the right is an unselected string with the SHE 1102 separating the selected string from the unselected string. In each of these strings, the SGDs 1106a, 1106b are sandwiched between a lowermost of the SGDTs 1104a, 1104b and an uppermost of the dummy memory cells 1108a, 1108b.

Figure 12:
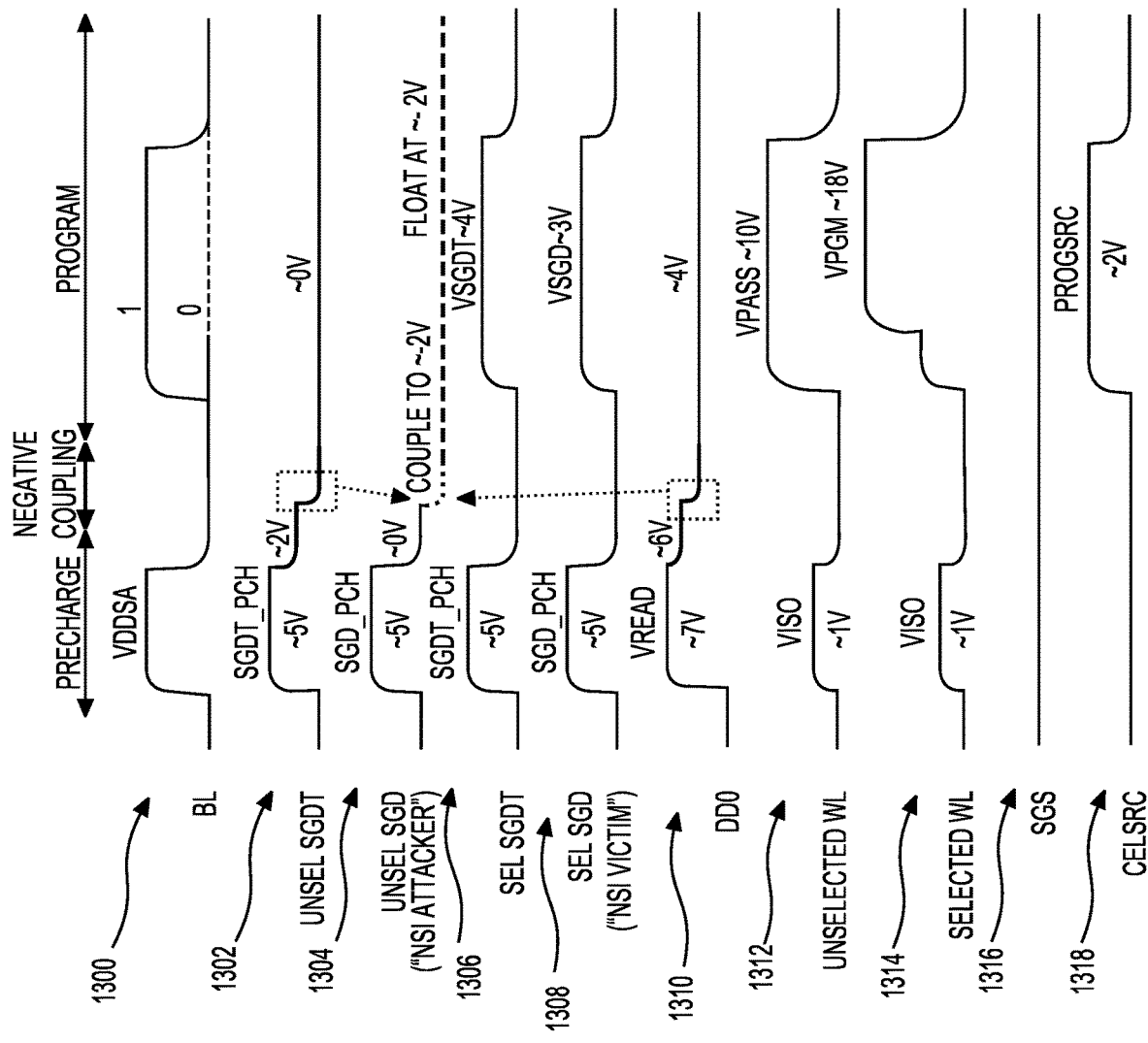
FIG. 12 depicts the voltages that are applied to various components of the memory device during a programming operation of a programming loop.

FIG. 12 illustrates the waveforms of a plurality of elements of the memory device illustrated in FIG. 11 during a programming operation. Specifically, 1300 illustrates the voltages applied to a bit line; 1302 illustrates the voltages of the unselected SGDTs; 1304 illustrates the voltages of the unselected SGD (i.e., "the NSI attacker"); 1306 illustrates the voltages of the selected SGDTs; 1308 illustrates the voltages of the selected SGD (i.e., the "NSI victim"); 1310 illustrates the voltages applied to the control gate of the dummy word line DD0; 1312 illustrates the voltages applied to the control gates of the unselected word lines; 1314 illustrates the voltages applied to the control gates of the selected word line; 1316 illustrates the voltages applied to the SGS; and 1318 illustrates the voltages applied to a common source line (CELSRC).

The programming operation includes three stages: a pre-charge stage, a negative coupling stage, and a program stage. During the pre-charge stage, the unselected SGDTs 1302 are driven to an SGDT_PCH voltage, and the NSI attacker SGDs 1304 are driven to an SGD_PCH voltage. In the exemplary embodiment, SGD_PCH and SGDT_PCH are approximately five Volts (5 V). The first dummy word line DD0 1310 is driven to a VREAD voltage, e.g., approximately seven Volts (7 V).

At the negative coupling stage, the unselected SGDTs 1302 are first ramped from SGDT_PCH to a lower voltage, e.g., two Volts (2 V). Simultaneously, the NSI attacker SGDs 1304 are ramped to a much lower voltage, such as zero Volts (0 V), and the first dummy word line DD0 1310 is ramped down by approximately one Volt (1 V) to a lower voltage, such as six Volts (6 V).

Next, the NSI attacker SGDs 1304 are floated, i.e., electrically disconnected. With the NSI attacker SGDs 1304 electrically floating, the unselected SGDTs are ramped to a ground voltage, such as zero Volts (0 V), and the first dummy word line DD0 is also ramped downwardly by two Volts, e.g., from six Volts (6 V) to four Volts (4 V). With reference to FIG. 11, at this time, two dielectric layers undergo the capacitance coupling effect. Specifically, the dielectric layers that undergo the capacitance coupling effect are the dielectric layer between the lowermost SGDT 1104*b* and the upper NSI attacker SGD 1106*b* and the dielectric layer between the dummy memory cell 1108*b* of the first dummy word line DD0 and the lower NSI attacker SGD 1106*b*. Referring back to FIG. 12, this capacitance coupling effect lowers the voltages of the NSI attacker SGDs 1304 from zero Volts (0 V) to a negative voltage, e.g., negative two Volts (−2 V). In other words, the negative capacitance coupling causes the NSI attacker SGDs 1304 to fall along with the voltages of the unselected SGDTs 1302 and the dummy word line DD0 1310. The NSI attacker SGDs 1304 remain at the negative voltage for the duration of the program stage of the programming operation, thereby minimizing the NSI effect during the programming operation.

Figure 13:
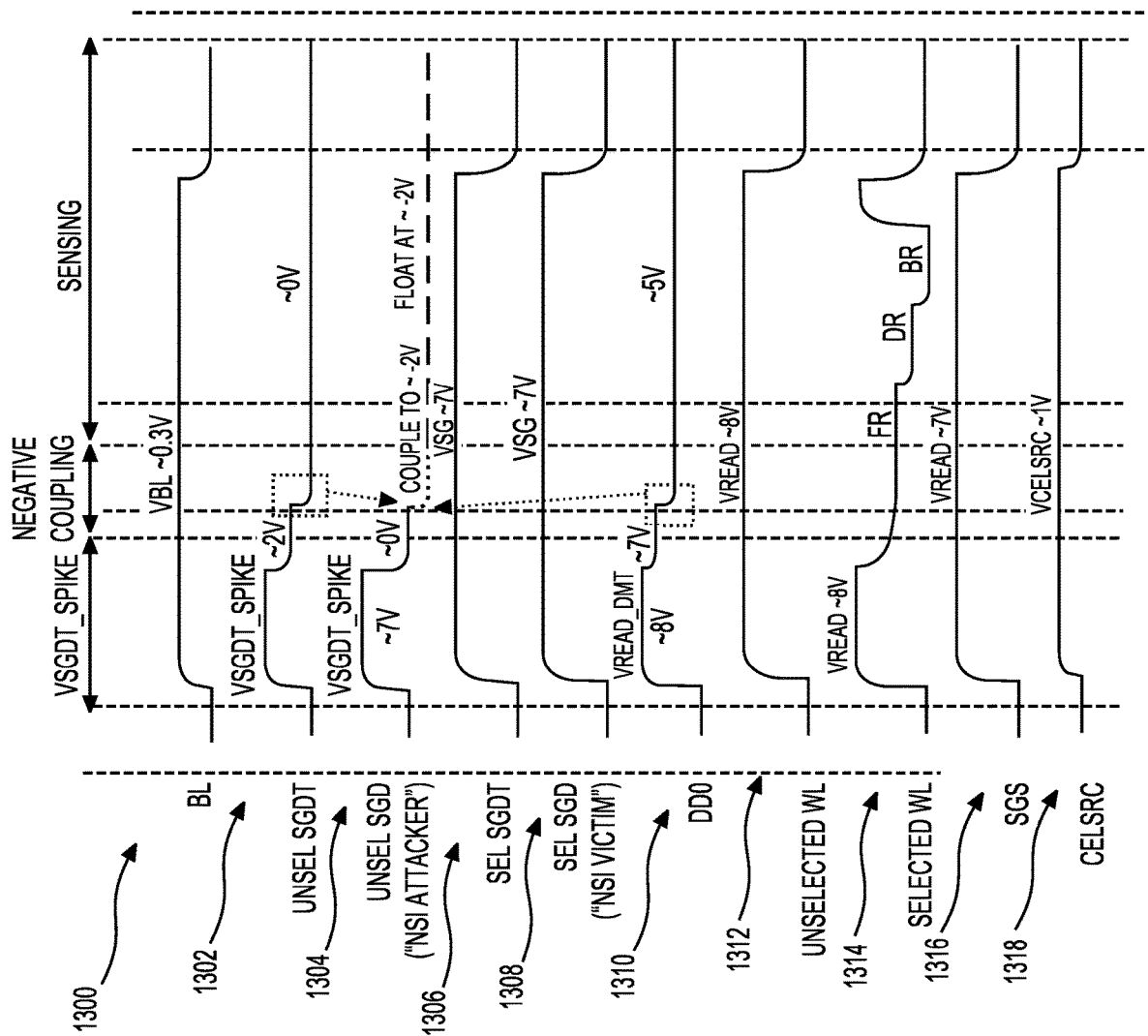
FIG. 13 depicts the voltages that are applied to various components of the memory device during a programming operation of a programming loop.

FIG. 13 illustrates the waveforms of the same elements of the memory device as illustrated in FIG. 12 but during a sensing operation, i.e., during either read or verify. The sensing operation includes three stages: a VSGDT Spike stage, a negative coupling stage, and a sensing stage. During the pre-charge stage, the unselected SGDTs 1302 are driven to an VSGDT_Spike voltage, and the NSI attacker SGDs 1304 are driven to an VSGD_Spike voltage. In the exemplary embodiment, VSGDT_Spike and VSGD_Spike are approximately seven Volts (7 V). The first dummy word line DD0 1310 is driven to a VREAD voltage, e.g., approximately seven Volts (7 V). The first dummy word line DD0 1310 is driven to a VREAD_DMT voltage, e.g., approximately eight Volts (8 V).

At the negative coupling stage, the unselected SGDTs 1302 are first ramped from VSGDT_Spike to a lower voltage, e.g., two Volts (2 V). Simultaneously, the NSI attacker SGDs 1304 are ramped to a much lower voltage, such as zero Volts (0 V), and the first dummy word line DD0 1310 is ramped down by approximately one Volt (1 V) to a lower voltage, such as seven Volts (7 V).

Next, the NSI attacker SGDs 1304 are floated, i.e., electrically disconnected from the adjacent components. With the NSI attacker SGDs 1304 electrically floating, the unselected SGDTs 1302 are ramped to a ground voltage, such as zero Volts (0 V), and the first dummy word line DD0 1310 is also ramped downwardly by two Volts, e.g., from seven Volts (7 V) to five Volts (5 V). With reference to FIG. 11, at this time, the capacitance coupling effect occurs within two dielectric layers. Specifically, the dielectric layer between the lowermost SGDT 1104*b* and the upper NSI attacker SGD 1106B experiences the capacitance coupling effect, and the dielectric layer between the first dummy word line DD0 1108*b* and the lower NSI attacker SGD 1106*b* also experiences the capacitance coupling effect. Referring back to FIG. 13, this capacitance coupling effect lowers the voltages of the NSI attacker SGDs 1304 from zero Volts (0 V) to a negative voltage, e.g., negative two Volts (−2 V). In other words, the negative capacitance coupling effect causes the voltages of the NSI attacker SGDs 1304 to fall as the voltages of the unselected SGDTs 1302 and the first dummy word line DD0 1310 fall. The NSI attacker SGDs 1304 remain at the negative voltage for the duration of the program state of the programming operation, thereby minimizing the NSI effect during the programming operation.

Figure 14:
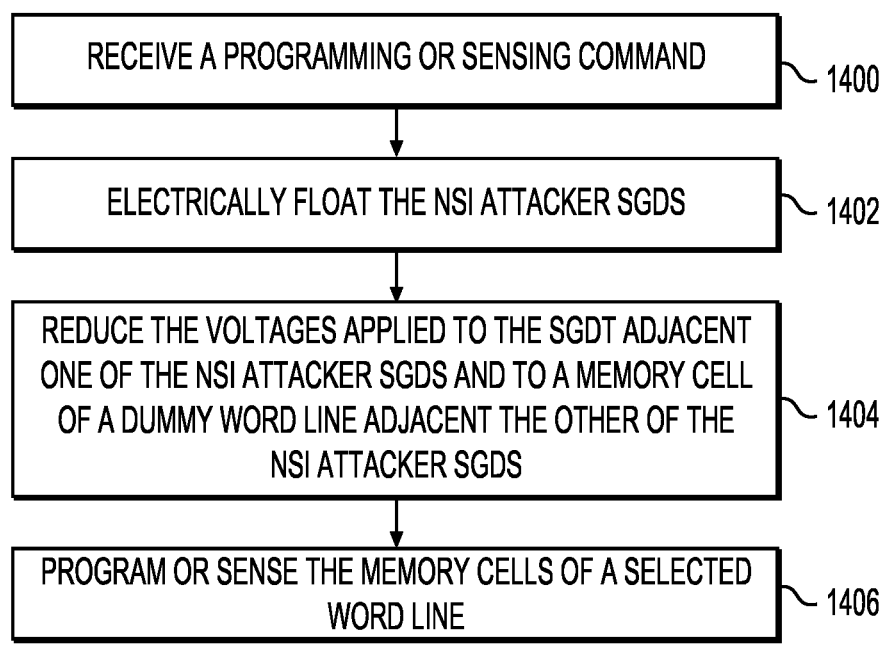
FIG. 14 is a flow chart illustrating the steps of a programming operation or a sensing operation according to another aspect of the present disclosure.

Referring now to FIG. 14, a flow chart is provided depicting the steps of performing a programming or sensing operation in a memory device according to an exemplary embodiment. At step 1400, a controller or control circuitry of the memory device receives a programming or a sensing command. At step 1402, the controller automatically electrically floats the NSI attacker SGDs. In an embodiment, two adjacent NSI attacker SGDs, which are located between an SGDT and a memory cell of a dummy word line, may be floated. At step 1404, voltages applied to the SGDT and to the memory cell of the dummy word line are reduced to reduce the voltages of the NSI attacker SGDs. In an embodiment, the voltages of the NSI attacker SGDs are reduced below zero Volts (0 V). At step 1406, the controller programs or senses the memory cells of a selected word line while the NSI attacker SGDs remain floating.

The several aspects of the present disclosure may be embodied in the form of an apparatus, system, method, or computer program process. Therefore, aspects of the present disclosure may be entirely in the form of a hardware embodiment or a software embodiment (including but not limited to firmware, resident software, micro-code, or the like), or may be a combination of both hardware and software components that may generally be referred to collectively as a "circuit," "module," "apparatus," or "system." Further, various aspects of the present disclosure may be in the form of a computer program process that is embodied, for example, in one or more non-transitory computer-readable storage media storing computer-readable and/or executable program code.

Additionally, various terms are used herein to refer to particular system components. Different companies may refer to a same or similar component by different names and this description does not intend to distinguish between components that differ in name but not in function. To the extent that various functional units described in the following disclosure are referred to as "modules," such a characterization is intended to not unduly restrict the range of potential implementation mechanisms. For example, a "module" could be implemented as a hardware circuit that includes customized very-large-scale integration (VLSI) circuits or gate arrays, or off-the-shelf semiconductors that include logic chips, transistors, or other discrete components. In a further example, a module may also be implemented in a programmable hardware device such as a field programmable gate array (FPGA), programmable array logic, a programmable logic device, or the like. Furthermore, a module may also, at least in part, be implemented by software executed by various types of processors. For example, a module may comprise a segment of executable code constituting one or more physical or logical blocks of computer instructions that translate into an object, process, or function. Also, it is not required that the executable portions of such a module be physically located together, but rather, may comprise disparate instructions that are stored in different locations and which, when executed together, comprise the identified module and achieve the stated purpose of that module. The executable code may comprise just a single instruction or a set of multiple instructions, as well as be distributed over different code segments, or among different programs, or across several memory devices, etc. In a software, or partial software, module implementation, the software portions may be stored on one or more computer-readable and/or executable storage media that include, but are not limited to, an electronic, magnetic, optical, electromagnetic, infrared, or semiconductor-based system, apparatus, or device, or any suitable combination thereof. In general, for purposes of the present disclosure, a computer-readable and/or executable storage medium may be comprised of any tangible and/or non-transitory medium that is capable of containing and/or storing a program for use by or in connection with an instruction execution system, apparatus, processor, or device.

Similarly, for the purposes of the present disclosure, the term "component" may be comprised of any tangible, physical, and non-transitory device. For example, a component may be in the form of a hardware logic circuit that is comprised of customized VLSI circuits, gate arrays, or other integrated circuits, or is comprised of off-the-shelf semiconductors that include logic chips, transistors, or other discrete components, or any other suitable mechanical and/or electronic devices. In addition, a component could also be implemented in programmable hardware devices such as field programmable gate arrays (FPGA), programmable array logic, programmable logic devices, etc. Furthermore, a component may be comprised of one or more silicon-based integrated circuit devices, such as chips, die, die planes, and packages, or other discrete electrical devices, in an electrical communication configuration with one or more other components via electrical conductors of, for example, a printed circuit board (PCB) or the like. Accordingly, a module, as defined above, may in certain embodiments, be embodied by or implemented as a component and, in some instances, the terms module and component may be used interchangeably.

Where the term "circuit" is used herein, it includes one or more electrical and/or electronic components that constitute one or more conductive pathways that allow for electrical current to flow. A circuit may be in the form of a closed-loop configuration or an open-loop configuration. In a closed-loop configuration, the circuit components may provide a return pathway for the electrical current. By contrast, in an open-looped configuration, the circuit components therein may still be regarded as forming a circuit despite not including a return pathway for the electrical current. For example, an integrated circuit is referred to as a circuit irrespective of whether the integrated circuit is coupled to ground (as a return pathway for the electrical current) or not. In certain exemplary embodiments, a circuit may comprise a set of integrated circuits, a sole integrated circuit, or a portion of an integrated circuit. For example, a circuit may include customized VLSI circuits, gate arrays, logic circuits, and/or other forms of integrated circuits, as well as may include off-the-shelf semiconductors such as logic chips, transistors, or other discrete devices. In a further example, a circuit may comprise one or more silicon-based integrated circuit devices, such as chips, die, die planes, and packages, or other discrete electrical devices, in an electrical communication configuration with one or more other components via electrical conductors of, for example, a printed circuit board (PCB). A circuit could also be implemented as a synthesized circuit with respect to a programmable hardware device such as a field programmable gate array (FPGA), programmable array logic, and/or programmable logic devices, etc. In other exemplary embodiments, a circuit may comprise a network of non-integrated electrical and/or electronic components (with or without integrated circuit devices). Accordingly, a module, as defined above, may in certain embodiments, be embodied by or implemented as a circuit.

It will be appreciated that example embodiments that are disclosed herein may be comprised of one or more microprocessors and particular stored computer program instructions that control the one or more microprocessors to implement, in conjunction with certain non-processor circuits and other elements, some, most, or all of the functions disclosed herein. Alternatively, some or all functions could be implemented by a state machine that has no stored program instructions, or in one or more application-specific integrated circuits (ASICs) or field-programmable gate arrays (FPGAs), in which each function or some combinations of certain of the functions are implemented as custom logic. A combination of these approaches may also be used. Further, references below to a "controller" shall be defined as comprising individual circuit components, an application-specific integrated circuit (ASIC), a microcontroller with controlling software, a digital signal processor (DSP), a field programmable gate array (FPGA), and/or a processor with controlling software, or combinations thereof.

Further, the terms "program," "software," "software application," and the like as may be used herein, refer to a sequence of instructions that is designed for execution on a computer-implemented system. Accordingly, a "program," "software," "application," "computer program," or "software application" may include a subroutine, a function, a procedure, an object method, an object implementation, an executable application, an applet, a servlet, a source code, an object code, a shared library/dynamic load library and/or other sequence of specific instructions that is designed for execution on a computer system.

Additionally, the terms "couple," "coupled," or "couples," where may be used herein, are intended to mean either a direct or an indirect connection. Thus, if a first device couples, or is coupled to, a second device, that connection may be by way of a direct connection or through an indirect connection via other devices (or components) and connections.

Regarding, the use herein of terms such as "an embodiment," "one embodiment," an "exemplary embodiment," a "particular embodiment," or other similar terminology, these terms are intended to indicate that a specific feature, structure, function, operation, or characteristic described in connection with the embodiment is found in at least one embodiment of the present disclosure. Therefore, the appearances of phrases such as "in one embodiment," "in an embodiment," "in an exemplary embodiment," etc., may, but do not necessarily, all refer to the same embodiment, but rather, mean "one or more but not all embodiments" unless expressly specified otherwise. Further, the terms "comprising," "having," "including," and variations thereof, are used in an open-ended manner and, therefore, should be interpreted to mean "including, but not limited to . . . " unless expressly specified otherwise. Also, an element that is preceded by "comprises . . . a" does not, without more constraints, preclude the existence of additional identical elements in the subject process, method, system, article, or apparatus that includes the element.

The terms "a," "an," and "the" also refer to "one or more" unless expressly specified otherwise. In addition, the phrase "at least one of A and B" as may be used herein and/or in the following claims, whereby A and B are variables indicating a particular object or attribute, indicates a choice of A or B, or both A and B, similar to the phrase "and/or." Where more than two variables are present in such a phrase, this phrase is hereby defined as including only one of the variables, any one of the variables, any combination (or sub-combination) of any of the variables, and all of the variables.

Further, where used herein, the term "about" or "approximately" applies to all numeric values, whether or not explicitly indicated. These terms generally refer to a range of numeric values that one of skill in the art would consider equivalent to the recited values (e.g., having the same function or result). In certain instances, these terms may include numeric values that are rounded to the nearest significant figure.

In addition, any enumerated listing of items that is set forth herein does not imply that any or all of the items listed are mutually exclusive and/or mutually inclusive of one another, unless expressly specified otherwise. Further, the term "set," as used herein, shall be interpreted to mean "one or more," and in the case of "sets," shall be interpreted to mean multiples of (or a plurality of) "one or more," "ones or more," and/or "ones or mores" according to set theory, unless expressly specified otherwise.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of operating a memory device, comprising the steps of:
   preparing a memory device that includes a plurality of memory holes, a first group of the memory holes including full SGD transistors and a second group of the memory holes including a set of selected partial SGD transistors and a set of unselected partial SGD transistors;
   electrically floating a first unselected partial SGD transistor of the set of unselected partial SGD transistors; and
   with the at least one first unselected partial SGD transistor electrically floating, reducing a voltage applied to at least one transistor or memory cell adjacent the first unselected partial SGD transistor such that a voltage of the first unselected partial SGD transistor is decreased through a capacitance coupling effect.

2. The method as set forth in claim 1 wherein the step of reducing the voltage applied to at least one transistor or memory cell adjacent the first unselected partial SGD transistor is further defined as reducing the voltage applied to a memory cell of a dummy word line that does not store data.

3. The method as set forth in claim 1 wherein the step of reducing the voltage applied to the at least one transistor or memory cell adjacent the first unselected partial SGD transistor is further defined as reducing the voltage applied to an adjacent unselected partial SGD transistor of the set of unselected partial SGD transistors.

4. The method as set forth in claim 1 further including the step of electrically floating a second unselected partial SGD transistor of the set of unselected partial SGD transistors.

5. The method as set forth in claim 4 wherein the first and second unselected partial SGD transistors are adjacent one another and are located between another unselected partial SGD transistor and a memory cell of a dummy word line.

6. The method as set forth in claim 5 wherein the step of reducing the voltage applied to at least one transistor or memory cell is further defined as reducing the voltages applied to the another unselected partial SGD transistor and to the memory cell of the dummy word line such that the voltages of both the first and second unselected partial SGD transistors are decreased through the capacitance coupling effect.

7. The method as set forth in claim 1 wherein the steps are a part of a programming operation.

8. The method as set forth in claim 1 wherein the steps are a part of a sensing operation.

9. A memory device, comprising:
   a plurality of memory holes including a first group of memory holes and a second group of memory holes, the first group of memory holes including full select gate drains, and the second group of memory holes including a set of unselected partial SGD transistors and a set of selected partial SGD transistors;
   control circuitry in electrical communication with the plurality of memory holes, the control circuitry being configured to:
      electrically float a first unselected partial SGD transistor of the set of unselected partial SGD transistors, and
      with the at least one unselected partial SGD transistor electrically floating, reduce a voltage applied to at least one transistor or memory cell adjacent the first unselected partial SGD transistor such that a voltage of the first unselected partial SGD transistor is decreased through a capacitance coupling effect.

10. The memory device as set forth in claim 9 wherein the at least one transistor or memory cell adjacent the first unselected partial SGD transistor is a memory cell of a dummy word line that does not store data.

11. The memory device as set forth in claim 9 wherein the at least one transistor or memory cell is an adjacent unselected partial SGD transistor of the set of unselected partial SGD transistors.

12. The memory device as set forth in claim 9 wherein the control circuitry is further configured to electrically float a second unselected partial SGD transistor of the set of unselected partial SGD transistors.

13. The memory device as set forth in claim 12 wherein the first and second unselected partial SGD transistors are adjacent to one another and are located between another unselected partial SGD transistor and a memory cell of a dummy word line.

14. The memory device as set forth in claim 13 wherein the control circuitry is further configured to reduce the voltages applied to the another unselected partial SGD transistor and the memory cell of the dummy word line such that the voltages of both the first and second unselected partial SGD transistors are decreased through the capacitance coupling effect.

15. The memory device as set forth in claim 9 wherein the control circuitry is configured to electrically float the first unselected partial SGD transistor and reduce the voltage applied to the at least one transistor or memory cell during a programming operation.

16. The memory device as set forth in claim 9 wherein the control circuitry is configured to electrically float the first unselected partial SGD transistor and reduce the voltage applied to the at least one transistor or memory cell during a sensing operation.

17. An apparatus, comprising:
a memory device including a plurality of full memory holes having full SGD transistors and a plurality of partial memory holes having partial SGD transistors;
the memory device further including a programming and sensing means for programming and reading a plurality of memory cells, the programming and sensing means being configured to:
electrically float a first unselected partial SGD transistor, and
with the at least one unselected partial SGD transistor electrically floating, reduce a voltage applied to at least one transistor or memory cell adjacent the first unselected partial SGD transistor such that a voltage of the first unselected partial SGD transistor is decreased through a capacitance coupling effect.

18. The apparatus as set forth in claim 17 wherein the at least one transistor or memory cell adjacent the first unselected partial SGD transistor is a memory cell of a dummy word line that does not store data.

19. The apparatus as set forth in claim 9 wherein the at least one transistor or memory cell is an adjacent unselected partial SGD transistor of the set of unselected partial SGD transistors.

20. The apparatus as set forth in claim 9 wherein the programming and sensing means is further configured to electrically float a second unselected partial SGD transistor of the set of unselected partial SGD transistors.

* * * * *